(12) United States Patent
Peters et al.

(10) Patent No.: US 11,799,026 B2
(45) Date of Patent: Oct. 24, 2023

(54) SIC DEVICE HAVING A DUAL MODE SENSE TERMINAL, ELECTRONIC SYSTEMS FOR CURRENT AND TEMPERATURE SENSING, AND METHODS OF CURRENT AND TEMPERATURE SENSING

(71) Applicant: Infineon Technologies AG, Neubiberg (DE)

(72) Inventors: Dethard Peters, Hoechstadt (DE); Sascha Axel Baier, Neubiberg (DE); Tomas Manuel Reiter, Munich (DE); Sandeep Walia, Villach (AT); Frank Wolter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 329 days.

(21) Appl. No.: 17/181,408

(22) Filed: Feb. 22, 2021

(65) Prior Publication Data

US 2022/0271156 A1 Aug. 25, 2022

(51) Int. Cl.
*H01L 29/78* (2006.01)
*G01R 31/52* (2020.01)
*G01K 7/16* (2006.01)
*G01R 31/26* (2020.01)
*G01R 31/27* (2006.01)
(Continued)

(52) U.S. Cl.
CPC ............ *H01L 29/7815* (2013.01); *G01K 7/16* (2013.01); *G01R 31/2628* (2013.01); *G01R 31/27* (2013.01); *G01R 31/2831* (2013.01); *G01R 31/52* (2020.01); *H01L 29/1608* (2013.01); *H01L 29/7805* (2013.01); *H01L 29/7813* (2013.01)

(58) Field of Classification Search
CPC .. H01L 29/1608; H01L 29/1066; G01R 31/27
See application file for complete search history.

(56) References Cited

U.S. PATENT DOCUMENTS

2011/0049621 A1\* 3/2011 Lotfi ................. H01L 29/66689
257/338
2012/0224288 A1\* 9/2012 Uota .................. H03K 17/0828
361/79

(Continued)

*Primary Examiner* — Jermele M Hollington
*Assistant Examiner* — Temilade S Rhodes-Vivour
(74) *Attorney, Agent, or Firm* — Murphy, Bilak & Homiller, PLLC

(57) ABSTRACT

A semiconductor die includes: a SiC substrate; power and current sense transistors integrated in the substrate such that the current sense transistor mirrors current flow in the main power transistor; a gate terminal electrically connected to gate electrodes of both transistors; a drain terminal electrically connected to a drain region in the substrate and which is common to both transistors; a source terminal electrically connected to source and body regions of the power transistor; a dual mode sense terminal; and a doped resistor region in the substrate between the transistors. The dual mode sense terminal is electrically connected to source and body regions of the current sense transistor. The doped resistor region has a same conductivity type as the body regions of both transistors and is configured as a temperature sense resistor that electrically connects the source terminal to the dual mode sense terminal.

20 Claims, 12 Drawing Sheets

(51) Int. Cl.
     *G01R 31/28*   (2006.01)
     *H01L 29/16*   (2006.01)

(56) References Cited

U.S. PATENT DOCUMENTS

| | | | |
|---|---|---|---|
| 2015/0316503 A1* | 11/2015 | Hoque | H01L 29/78 |
| | | | 257/253 |
| 2015/0341029 A1* | 11/2015 | Franchini | H01L 29/7826 |
| | | | 327/434 |
| 2018/0138169 A1 | 5/2018 | Reiter et al. | |
| 2019/0273488 A1 | 9/2019 | Reiter et al. | |
| 2022/0209726 A1* | 6/2022 | Saji | H01L 27/06 |

* cited by examiner

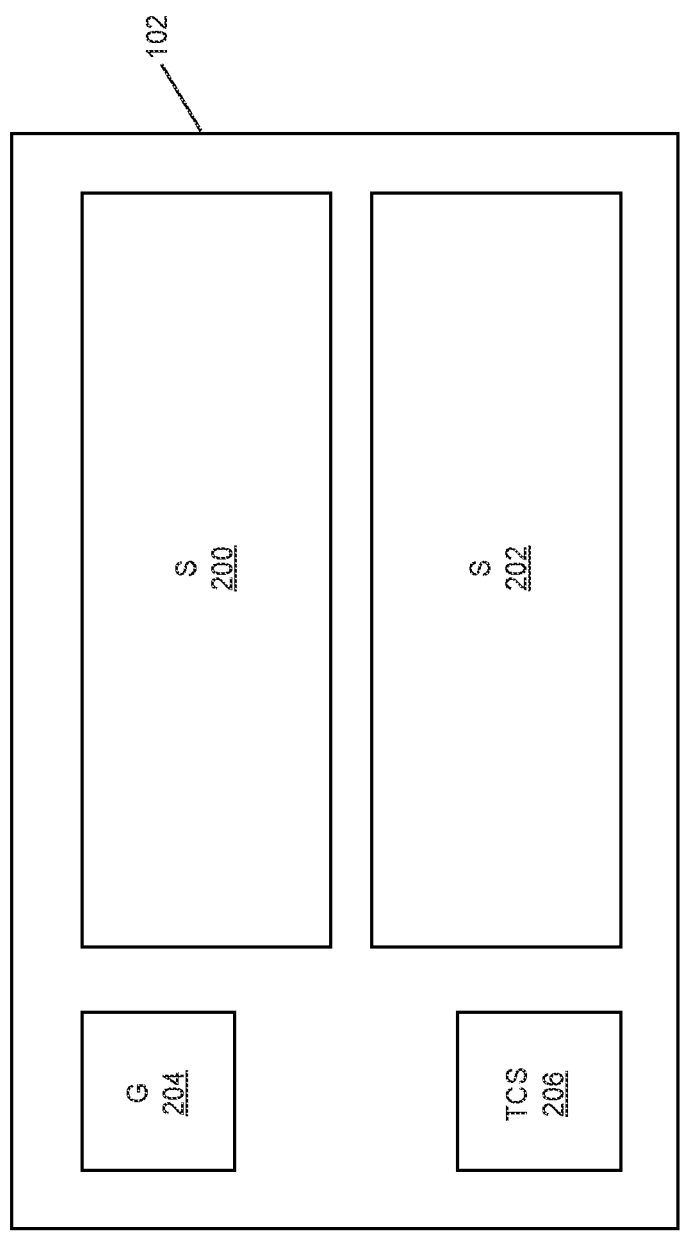

SIC DEVICE HAVING A DUAL MODE SENSE TERMINAL, ELECTRONIC SYSTEMS FOR CURRENT AND TEMPERATURE SENSING, AND METHODS OF CURRENT AND TEMPERATURE SENSING

BACKGROUND

Fault conditions such as short-circuits are important considerations in various applications which impact the loss performance of power transistors, by the need to limit the channel current. SiC-based power MOSFETs (metal-oxide semiconductor field-effect transistors) having smaller chip (die) area and high current density leads to a weaker short-circuit ability and reduced short-circuit withstand time. Accordingly, the device should be turned off in a proper manner as early as possible before occurring a short circuit or overcurrent situation. To this end, on-chip sensing is widely used for power electronics system self-protection. Besides current sensing, on-chip temperature sensing provides additional information about fault conditions. Such fault conditions may include excessive power dissipation, excessive ambient/coolant fluid temperatures, low convection or low fluid flow rates, loss of fluid flow, air bubbles in coolant fluid, wrong coolant fluid mixture, etc.

Different kinds of external detection methods include desaturation detection and overcurrent detection implemented using Hall sensors. However, these detection methods cannot detect a failure before extreme short circuit conditions occur and are too slow and/or cannot detect short circuits over a half bridge.

Integrated on-chip current sensors and temperature sensors enable fast overcurrent protection and over-temperature protection. A fraction of active MOSFET cells in the chip are typically used for current and temperature observation. The sense cells are separated from the main transistor cells using an additional lithography process step which increases the wafer fabrication process cost and complexity. Also, five (5) terminals are typically used in the integrated temperature and current sense power devices to get the temperature and current sense signals. Three (3) terminals are used for power device operation (source, drain and gate) and two (2) terminals are used for sensing current and temperature. Each additional terminal used for sensing leads to loss of chip active area and requires high connection efforts which results in low package utilization.

Thus, there is a need for an improved current and temperature sensing approach for power semiconductor devices.

SUMMARY

According to an embodiment of a semiconductor die, the semiconductor die comprises: a SiC substrate; a power transistor and a current sense transistor integrated in the SiC substrate such that the current sense transistor is configured to mirror current flow in the main power transistor; a gate terminal electrically connected to gate electrodes of both of the transistors; a drain terminal electrically connected to a drain region in the SiC substrate and which is common to both of the transistors; a source terminal electrically connected to source and body regions of the power transistor; a dual mode sense terminal; and a doped resistor region in the SiC substrate between the power transistor and the current sense transistor, wherein the dual mode sense terminal is electrically connected to source and body regions of the current sense transistor, wherein the doped resistor region has a same conductivity type as the body regions of both of the transistors and is configured as a temperature sense resistor that electrically connects the source terminal to the dual mode sense terminal.

According to an embodiment of a method of current and temperature sensing for a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the method comprises: in a first state: switching on the power transistor, the current sense transistor, and a toggle device such that the toggle device electrically couples the dual mode sense terminal of the semiconductor die to a current sense resistor; and sensing a voltage drop across the current sense resistor; and in a second state: switching off the power transistor, the current sense transistor, and the toggle device such that the toggle device electrically decouples the dual mode sense terminal of the semiconductor die from the current sense resistor; providing a constant current that flows through the temperature sense resistor of the semiconductor die, or electrically connecting a constant voltage source to the temperature sense resistor; and sensing a voltage drop between the source terminal and the dual mode sense terminal of the semiconductor die, or sensing a current flowing through the dual mode sense terminal.

According to an embodiment of an electronic system for sensing current and temperature of a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the electronic system comprising: a current sense resistor; a toggle device electrically coupling the dual mode sense terminal of the semiconductor die to the current sense resistor; a driver; and sense circuitry, wherein in a first state: the driver is configured to switch on the power transistor, the current sense transistor, and the toggle device such that the toggle device electrically couples the dual mode sense terminal of the semiconductor die to the current sense resistor; and the sense circuitry is configured to sense a voltage drop across the current sense resistor; and in a second state: the driver is configured to switch off the power transistor, the current sense transistor, and the toggle device such that the toggle device electrically decouples the dual mode sense terminal of the semiconductor die from the current sense resistor; and the sense circuitry is configured to provide a constant current that flows through the temperature sense resistor of the semiconductor die or electrically connect a constant voltage source to the temperature sense resistor, and sense a voltage drop between the source terminal and the dual mode sense terminal of the semiconductor die or sense a current flowing through the dual mode sense terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2 illustrates a top plan view of an embodiment of the semiconductor die.

DETAILED DESCRIPTION

Figure 1:
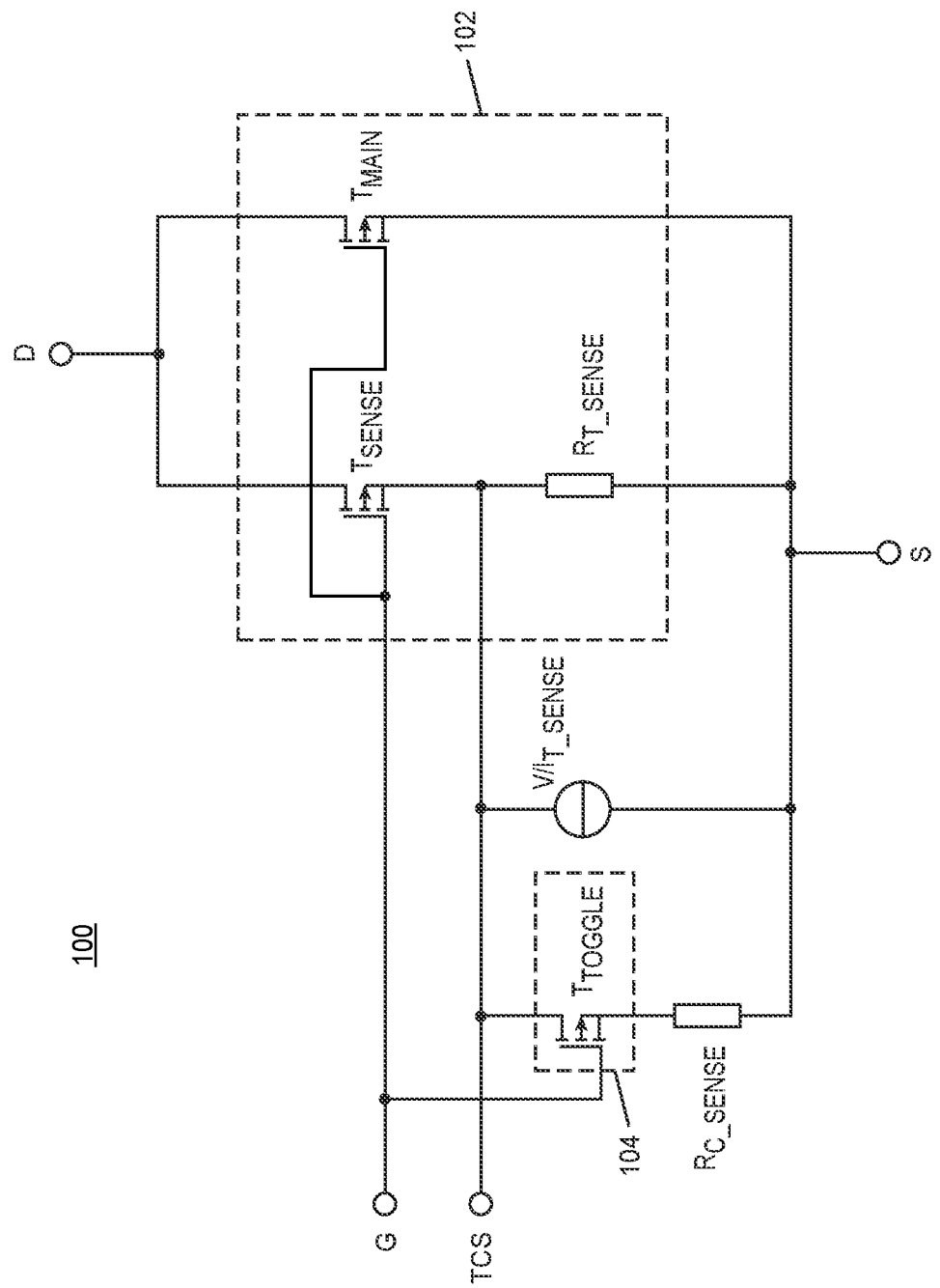
FIG. 1 illustrates a circuit schematic of an embodiment of an electronic system for sensing current and temperature of a semiconductor die having a dual mode sense terminal.

Described herein is an improved current and temperature sensing approach for SiC (silicon carbide) dies (chips). The SiC die has a dual mode sense terminal that allows for alternating between current sensing and temperature sensing using the same sense terminal instead of requiring two separate sense terminals. In a first state, a power transistor and a current sense transistor integrated in the SiC die are switched on and a current sense mode is active based on the current mirrored by the current sense transistor. In a second state, the power transistor and current sense transistor are switched off and a temperature sense mode is active based on the voltage drop across, or a current flowing through, a doped resistor integrated in the SiC die and configured as a temperature sense resistor. A signal processing circuit measures a current signal in the first state and a temperature signal in the second state, using the same dual mode sense terminal of the SiC die. The readout may be implemented using a common gate driver signal in combination with a small signal transistor and a small signal current source, allowing for a quasi-simultaneous monitoring of both temperature and current.

A combination of both current and temperature sensing functionalities in a single-die solution via a dual mode sense terminal is advantageous for power electronics self-protection. The current and temperature sensing functionalities provide system protection from device failure, provide system protection in case of a wrong wiring harness, failure in wiring harness, failure in load or electric machine, saturation of inductive load, wrong PWM (pulse width modulation) pattern, shoot through gate drive pattern, excessive power dissipation, excessive ambient/coolant fluid temperatures, low convection or low fluid flow rates, loss of fluid flow, air bubbles in coolant fluid, wrong coolant fluid mixture, etc. Power electronics system self-protection is required for many safety-critical applications such as the main inverter of a battery electric vehicle. This means a single failure of a power electronics system must not damage other systems. Consequently, failures must be avoided when possible. Safety relevant functions such as battery disconnect switches, fuses, pyro-fuses, etc. should only be necessary in very limited cases where the self-protection features do not function as expected since such elements are a final protection against catastrophic events such as fusing of high voltage batteries, fires, explosions, etc.

Described next, with reference to the figures, are exemplary embodiments of the current and temperature sensing approach. While the current and temperature sensing approach is described in the context of SiC devices, the current and temperature sensing approach may be applied to other types of wide-bandgap semiconductor devices and to non-wide-bandgap semiconductor devices such as Si-based devices. The term 'wide-bandgap semiconductor' as used herein refers to any semiconductor material having a bandgap greater than 1.5 eV. For example, the term 'wide-bandgap semiconductor' includes SiC and GaN (gallium nitride). Still other wide-bandgap semiconductor materials may be used. In the following embodiments, the first conductivity is n-type and the second conductivity type is p-type for an n-channel device whereas the first conductivity is p-type and the second conductivity type is n-type for a p-channel device.

FIG. 1 illustrates a circuit schematic of an embodiment of an electronic system 100 for sensing current and temperature of a semiconductor die having a dual mode sense terminal TCS. The electronic system 100 may be part of a power electronic system such as a DC/DC converter, an AC/DC converter, a DC/AC inverter, an AC/AC converter, etc.

The semiconductor die includes a power transistor $T_{Main}$ and a current sense transistor $T_{Sense}$ integrated in a SiC substrate 102. The SiC substrate 102 may include a base semiconductor and one or more epitaxial layers grown on the base semiconductor. The semiconductor die also includes a source terminal S, a drain terminal D, and a gate terminal G for power device operation.

A doped resistor region is integrated in the SiC substrate 102 between the power transistor $T_{Main}$ and the current sense transistor $T_{Sense}$ and is configured as a temperature sense resistor $R_{T\_Sense}$ that electrically connects the source terminal S to the dual mode sense terminal TCS. The doped resistor region that forms the integrated temperature sense resistor $R_{T\_Sense}$ of the semiconductor die has the same conductivity type as the body regions of both transistors $T_{Main}$, $T_{Sense}$ (p-type in the case of n-channel transistors and p-type in the case of p-channel transistors).

The electronic system 100 further includes a current sense resistor $R_{C\_Sense}$, a toggle device 104, and a small signal current source or a constant voltage source $V/I_{T\_Sense}$. The toggle device 104 electrically couples or decouples the dual mode sense terminal TCS of the semiconductor die to the current sense resistor $R_{C\_Sense}$ based on the state of operation. The toggle device 104 is illustrated as a small signal transistor $T_{Toggle}$ in FIG. 1.

In a first state, the power transistor $T_{Main}$ and the current sense transistor $T_{Sense}$ of the semiconductor die are switched on as is the toggle device 104 such that the toggle device 104 electrically couples the dual mode sense terminal TCS of the semiconductor die to the current sense resistor $R_{C\_Sense}$. The first-state configuration allows for sensing the current flowing through the power transistor $T_{Main}$ of the semiconductor die by sensing the voltage drop across the current sense resistor $R_{C\_Sense}$ as measured between the source terminal S and the dual mode sense terminal TCS of the semiconductor die.

In a second state, the power transistor $T_{Main}$ and the current sense transistor $T_{Sense}$ of the semiconductor die are switched off as is the toggle device 104 such that the toggle device 104 electrically decouples the dual mode sense terminal TCS of the semiconductor die from the current sense resistor $R_{C\_Sense}$ of the semiconductor die. The current/constant voltage source $V/I_{T\_Sense}$ provides a constant current in the second state that flows through the temperature sense resistor $R_{T\_Sense}$ of the semiconductor die, or electrically connects the constant voltage source $V/I_{T\_Sense}$ to the temperature sense resistor $R_{T\_Sense}$. The second-state configuration allows for temperature sensing of the semiconductor die by sensing the voltage drop across the temperature sense resistor $R_{T\_Sense}$ of the semiconductor die as measured between the source terminal S and the dual mode sense terminal TCS of the semiconductor die, or by sensing a current flowing through the dual mode sense terminal TCS. Accordingly, both temperature sensing and current sensing for the semiconductor die are provided via the same dual mode sense terminal TCS of the semiconductor die.

FIG. 2 illustrates a top plan view of an embodiment of the semiconductor die. According to this embodiment, the power transistor $T_{Main}$ included in the semiconductor die is a vertical device in that the primary current flow path for the power transistor $T_{Main}$ is between the two main opposing surfaces of the die. Accordingly, the source and drain terminals S, D are disposed at opposite sides of the semiconductor die with the drain terminal D being out of view in FIG. 2. The source terminal S is split into at least two separate pads 200, 202 in FIG. 2, as an example. A first additional pad 204 implements the gate terminal G and a second additional pad 206 implements the dual mode sense terminal TCS. In the case of a lateral power device, all terminals would be at the same side of the semiconductor die.

Figure 3A:
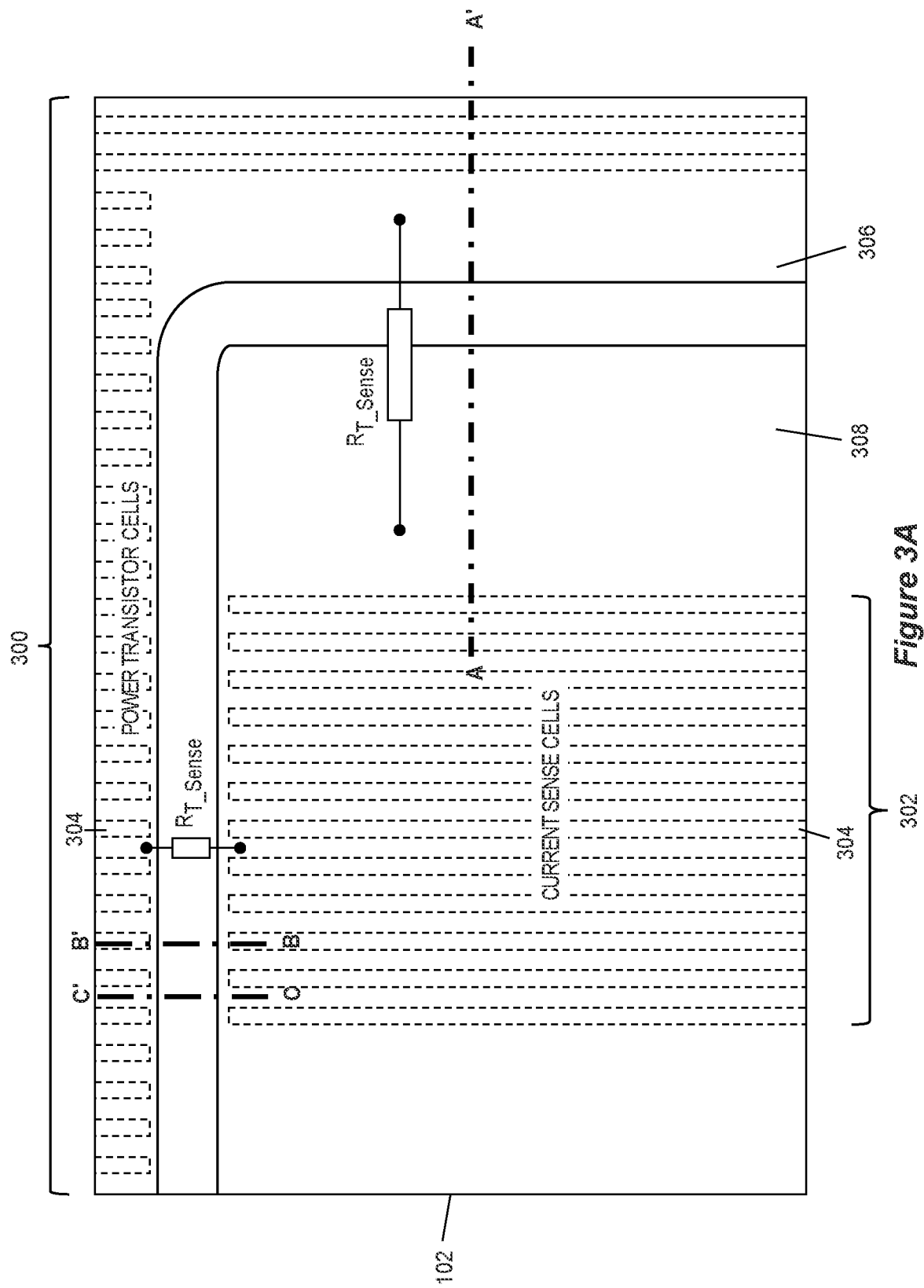
FIG. 3A illustrates a partial top plan view of the semiconductor die.
Figure 3B:
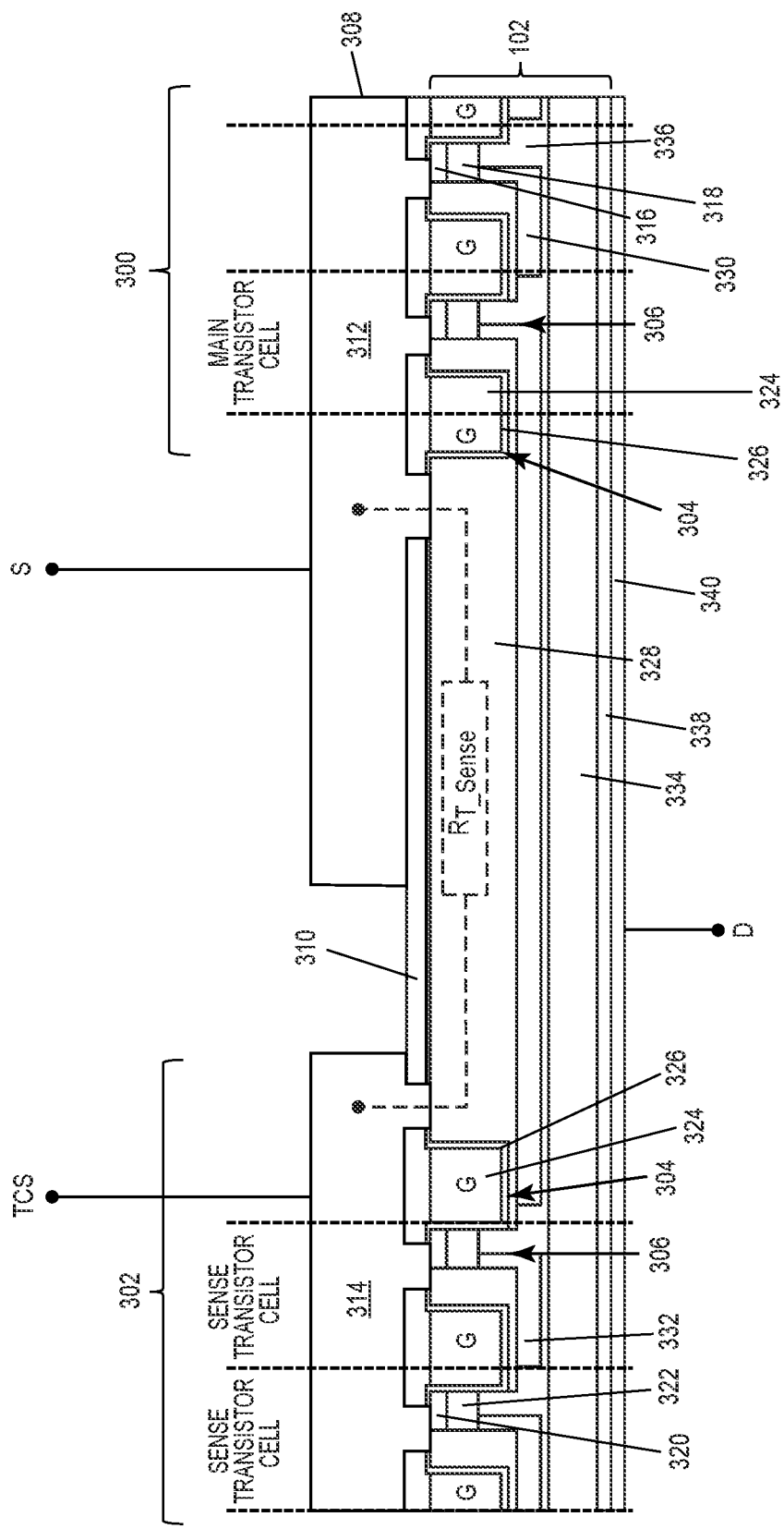
FIG. 3B illustrates a cross-sectional view of the semiconductor die along the line labelled A-A' in FIG. 3A.
Figure 3C:
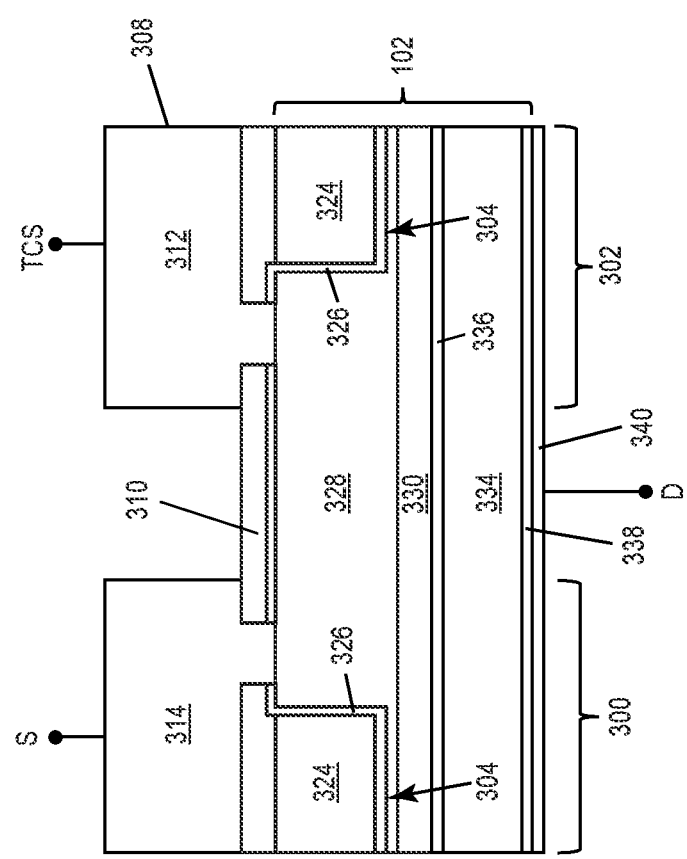
FIG. 3C illustrates a cross-sectional view of the semiconductor die along the line labelled B-B' in FIG. 3A.
Figure 3D:
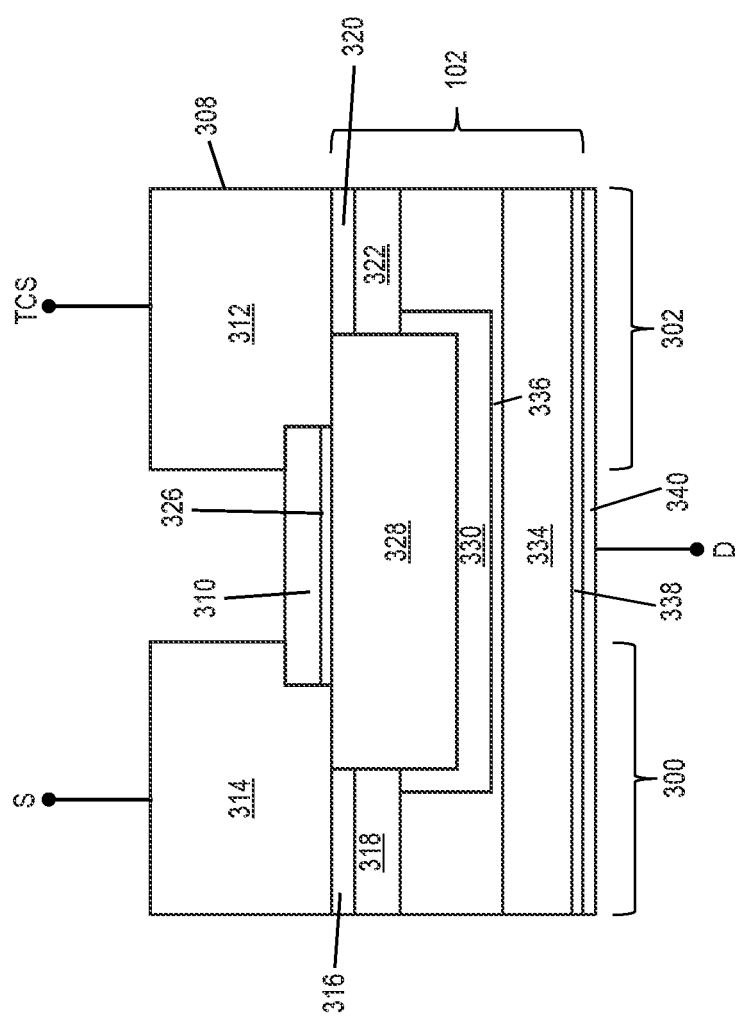
FIG. 3D illustrates a cross-sectional view of the semiconductor die along the line labelled C-C' in FIG. 3A.

FIG. 3A illustrates a partial top plan view of the semiconductor die. FIG. 3B illustrates a cross-sectional view of the semiconductor die along the line labelled A-A' in FIG. 3A. FIG. 3C illustrates a cross-sectional view of the semiconductor die along the line labelled B-B' in FIG. 3A. FIG. 3D illustrates a cross-sectional view of the semiconductor die along the line labelled C-C' in FIG. 3A.

Power transistor cells 300 form the power transistor $T_{Main}$ included in the semiconductor die and current sense cells 302 form the current sense transistor $T_{Sense}$ included in the semiconductor die. The power transistor cells 300 and the current sense cells 302 may have the same configuration, pitch, etc., but with fewer current sense cells 302 than power transistor cells 300. For example, the power transistor cells 300 and the current sense cells 302 may have a strip-like cell configuration with gate trenches 304 arranged as stripes and semiconductor mesas 306 separating the gate trenches 304.

A metallization layer 308 is separated from the SiC substrate 102 by an interlayer dielectric 310. The metallization layer 308 may comprise Al, Cu, AlCu, etc. and is segmented into a main source metallization region 312 and a sense source metallization region 314. The main source metallization region 312 forms or is electrically connected to the source terminal S of the semiconductor die, and contacts source and body regions 316, 318 of the opposite conductivity type in the semiconductor mesas 306 of the power transistor cells 300 through openings in the interlayer dielectric 310. The sense source metallization region 314 forms or is electrically connected to the dual mode sense terminal TCS of the semiconductor die, and contacts source and body regions 320, 322 of the opposite conductivity type in the semiconductor mesas 306 of the current sense cells 302. The gate trenches 304 of both transistor types include gate (G) electrodes 324 separated from the SiC substrate 102 by a gate dielectric 326.

The power transistor cells 300 and the current sense cells 302 are isolated from one another by a doped resistor region 328 of the same conductivity types as the body regions 318, 322 (e.g., p-type for an n-channel device) of the power transistor and current sense cells 300, 302. For example, the current sense transistor $T_{Sense}$ may be laterally surrounded by the main power transistor $T_{Main}$ in the SiC substrate 102 and the doped resistor region 328 may be formed in a region of the SiC substrate 102 that separates the current sense transistor $T_{Sense}$ from the main power transistor $T_{Main}$.

Along a side of the current sense transistor $T_{Sense}$, the doped resistor region 328 may extend uninterrupted between a gate trench 304 of the current sense transistor $T_{Sense}$ and a gate trench 304 of the main power transistor $T_{Main}$, e.g., as shown in FIG. 3B and FIG. 3C. The doped resistor region 328 may also adjoin mesas 306 of the SiC substrate 102 that separate adjacent ones of the stripe-shaped gate trenches 304 of the main power transistor $T_{Main}$ and that include the source and body regions 316, 318 of the power transistor $T_{Main}$, and may adjoin mesas 306 of the SiC substrate 102 that separate adjacent ones of the stripe-shaped gate trenches 304 of the current sense transistor $T_{Sense}$ and that include the source and body regions 320, 322 of the current sense transistor $T_{Sense}$, e.g., as shown in FIG. 3D.

The doped resistor region 328 is connected at one end to the main source metallization region 312 and at another end to the sense source metallization region 314 through corresponding openings in the interlayer dielectric 310. The doped resistor region 328 is temperature dependent and forms the temperature sense resistor $R_{T\_Sense}$ that electrically connects the source terminal S to the dual mode sense terminal TCS of the semiconductor die. Unlike polysilicon which has a positive temperature coefficient up to about 300° C. and a negative temperature coefficient above 300° C., the doped resistor region 328 of the SiC substrate 102 which forms the integrated temperature sense resistor $R_{T\_Sense}$ of the semiconductor die has a negative temperature coefficient up to at least 400° C. which makes the doped resistor region 328 more suitable for temperature sensing over a wider temperature range.

The doped resistor region 328 is doped in such a way to have sufficiently high resistive value, e.g., >15 kOhm. In one embodiment, the doped resistor region 328 has a sheet resistance of at least 10 kΩ/square at 25° C.

The doped resistor region 328 may be formed by the same implantation process used to form the body regions 318, 322 of the transistor cells 300, 302 and gate oxide shielding regions 330, 332 which may be formed at one side of the gate trenches 304, where the gate oxide shielding regions 330, 332 have the same conductivity type as the body regions 318, 322 and the doped resistor region 328. In this case, the dopant concentration of the doped resistor region 328 is higher than for the body regions 318, 322. The implantation process for the cell may thus be re-used but the resultant dopant concentration will not be the same.

For example, in the case of an n-channel SiC device and p-type doping for the resistor region 328, the resistor region 328 is highly sensitive to temperature due to incomplete ionization of acceptors and therefore can be used as an integrated temperature sense element when the main power transistor $T_{Main}$ is off and current flows in the reverse direction through the body diode of the current sense transistor $T_{Sense}$. In a particular area of the semiconductor die, the resistance of the doped resistor region 328 may be designed to satisfy a particular requirement. By adjusting the resistance of the doped resistor region 328 accordingly, ESD robustness of the semiconductor die may be adjusted according to a specific requirement.

The doped resistor region 328 functions as both a pn-junction and a temperature sense resistor. The pn-junction shields the top surface of the SiC substrate 102 from high electric fields, restricting the high electric fields to the SiC substrate 102. Such shielding is particularly important for wide-bandgap semiconductors such as SiC which typically experience 10× or higher electric fields than Si. As explained above, the doped resistor region 328 is highly sensitive to temperature. Accordingly, the doped resistor region 328 is used as an integrated sensor element by connecting the doped resistor region 328 between the main source metallization region 312 and the sense source metallization region 314 of the overlying metallization layer 308. The voltage across the temperature sense resistor $R_{T\_Sense}$ formed by the doped resistor region 328 may be sensed between the source terminal S and the current sense terminal TCS of the semiconductor die.

Since the doped resistor region 328 adequately isolates the power transistor cells 300 and the current sense cells 302 from one another, no additional photolithography steps are needed to provide such isolation which reduces wafer fabrication process cost and complexity. In FIG. 3A, the gate trenches 304 are obstructed by the overlying metallization layer 308 and therefore illustrated using dashed rectangles in this figure. The SiC substrate 102 also includes a drift zone 334 of the same conductivity type as the source regions 316, 320. A current spread region 336 also of the same conductivity type as the source regions 316, 320 may be formed in the drift zone 334 and have a higher doping concentration than the drift zone 334. The SiC substrate 102 may include a drain region 338 of the same conductivity type as the source regions 316, 320 below the drift zone 334, and a drain metallization layer 340 in contact with the drain region 338. In the case of a lateral device, the drain region 338 and drain metallization 340 of the semiconductor die would be disposed at the same side of the SiC substrate 102 as the source regions 316, 320.

Figure 4:
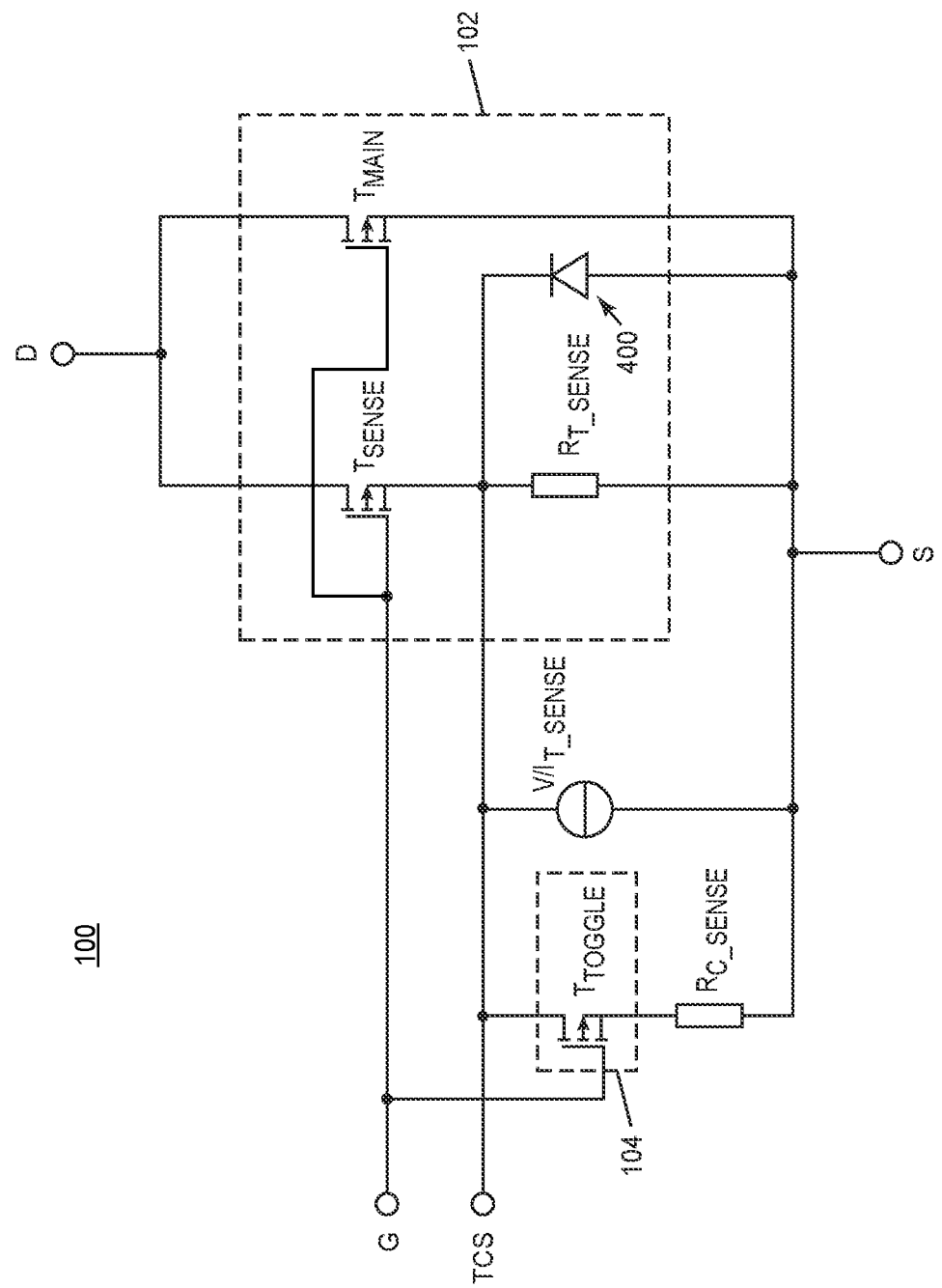
FIG. 4 illustrates a circuit schematic of another embodiment of the electronic system that includes the semiconductor die.

FIG. 4 illustrates a circuit schematic of another embodiment of the electronic system 100 that includes the semiconductor die. According to this embodiment, the semiconductor die further includes a diode 400 in the SiC substrate 102 and connected in parallel with the doped resistor region 328 that forms the temperature sense resistor $R_{T\_Sense}$ of the semiconductor die.

Figure 5:
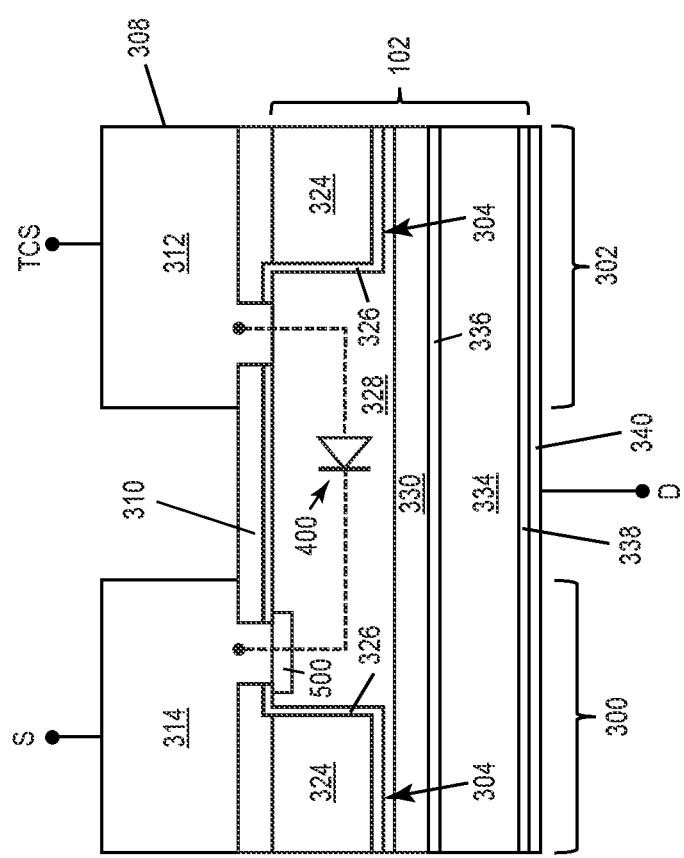
FIG. 5 illustrates the same cross-sectional view as FIG. 3C but with a diode included in the SiC substrate of the semiconductor die.

FIG. 5 illustrates the same cross-sectional view as FIG. 3C but with the diode 400 included in the SiC substrate 102. According to this embodiment, the doped resistor region 328 is p-type and the n-type cathode 500 of the diode 400 is formed in the doped resistor region 328. The cathode 500 contacts the sense source metallization region 314 that forms or is electrically connected to the dual mode sense terminal TCS of the semiconductor die. The p-type anode of the diode 400 is formed by the doped resistor region 328 in this embodiment.

The polarity of the diode 400 is such that useable only in forward conduction. The temperature signal provided with the diode embodiment is weaker compared to the non-diode embodiment, but more linear (e.g., about 1-2 mV/K) compared with the relative change of the doped resistor region 328 with temperature. The diode 400 may be beneficial in case of extreme ESD (electrostatic discharge) robustness requirements where the diode 400 provides both ESD and temperature sensing as features.

Figure 6:
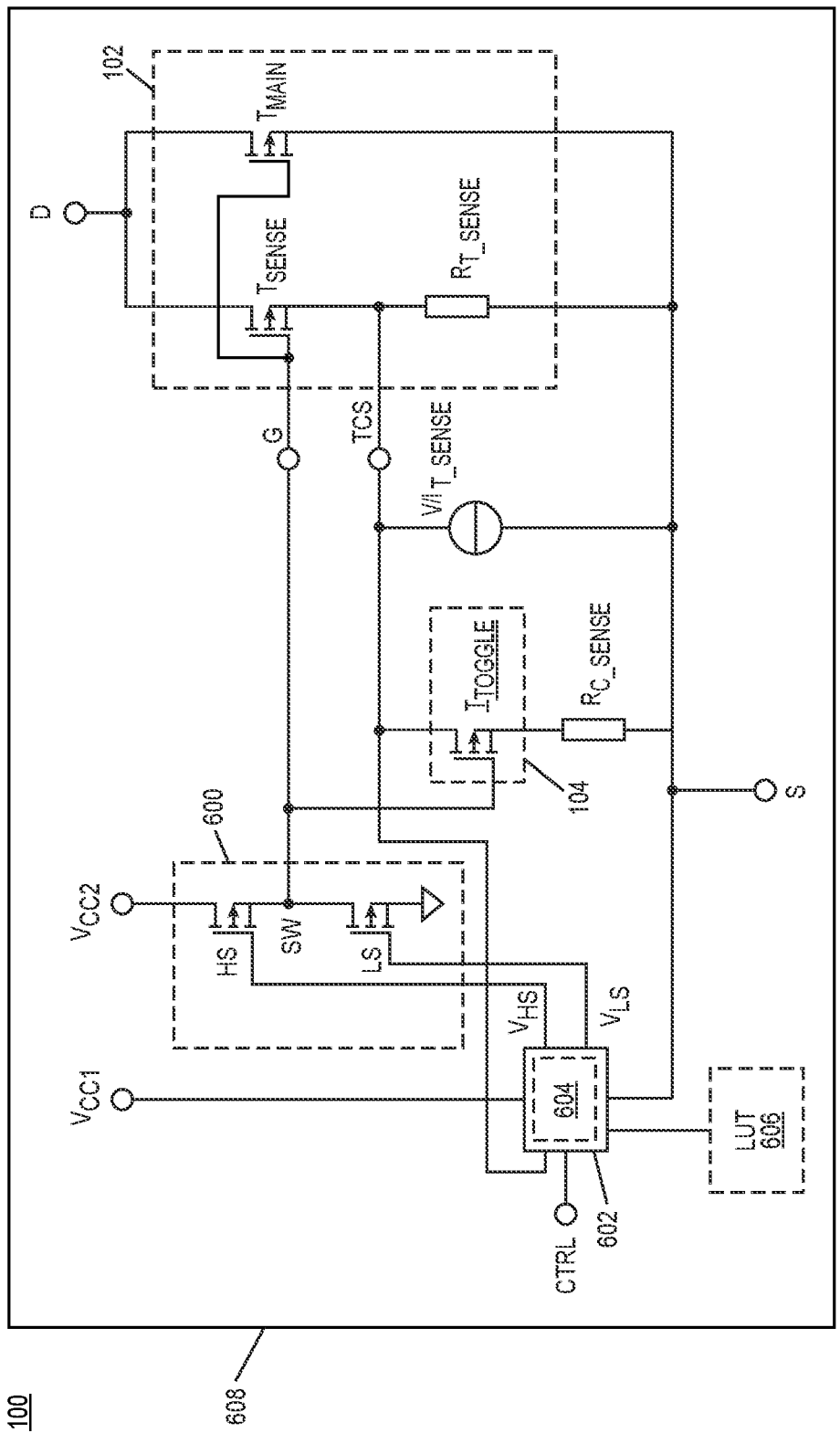
FIG. 6 illustrates a circuit schematic of another embodiment of the electronic system that includes the semiconductor die.

FIG. 6 illustrates a circuit schematic of another embodiment of the electronic system 100 that includes the semiconductor die. The semiconductor die may or may not include the diode 400 shown in FIGS. 4 and 5.

According to the embodiment shown in FIG. 6, the electronic system 100 further includes a gate driver stage 600 and a driver 602 having sense circuitry 604. The gate driver stage 600 may include a high-side switch HS coupled between a voltage supply $V_{CC2}$ and a switching node SW and a low-side switch LS coupled between the switching node SW and ground. The gate driver stage 600 is configured to switch on and off the power transistor $T_{Main}$, the current sense transistor $T_{Sense}$, and the toggle device 104 based on high-side and low-side switching signals $V_{HS}$, $V_{LS}$ provided by the driver 602.

The driver 602 is powered by a voltage supply $V_{CC1}$ and receives a switching control signal CTRL from another control device such as a microcontroller. The driver 602 converts the switching control signal CTRL into the high-side and low-side switching signals $V_{HS}$, $V_{LS}$, respectively, for the gate driver stage 600.

The driver 602 is coupled to the sense terminal S and the dual mode sense terminal TCS of the semiconductor die, enabling the sense circuitry 604 to sense both the current flowing in the semiconductor die and the temperature of the semiconductor die using the same dual mode sense terminal TCS of the die.

In the first state, the driver 602 causes the gate driver stage 600 to switch on the power transistor $T_{Main}$, the current sense transistor $T_{Sense}$, and the toggle device 104 such that the toggle device 104 electrically couples the dual mode sense terminal TCS of the semiconductor die to the current sense resistor $R_{C\_Sense}$. The current sense transistor $T_{Sense}$ is active in the first state and mirrors the current flowing in the power transistor $T_{Main}$. The mirrored current flows through the current sense resistor $R_{C\_Sense}$ via the activate (on) toggle device 104. The sense circuitry 604 senses the voltage drop across the current sense resistor $R_{C\_Sense}$, enabling current sensing of the power transistor $T_{Main}$ included in the semiconductor die.

The driver 602 or other circuit may include overvoltage protection circuitry such as a comparator that compares the voltage senses across the current sense resistor $R_{C\_Sense}$ to a reference value. The overvoltage protection circuitry forces off the power transistor $T_{Main}$ if the voltage drop sensed across the current sense resistor $R_{C\_Sense}$ exceeds a certain value, e.g., more than 300 mV. In one embodiment, a continuous readout is performed during the first state for current sensing/current protection and a triggered readout is performed during the second state for temperature sensing/temperature protection. The triggered readout in the second state accounts for temperature settling. The $R_{C\_Sense}$ and $R_{T\_Sense}$ resistor values may be in a range that normal operating currents result in a +/−300 mV voltage drop across the current sense resistor $R_{C\_Sense}$ and higher currents to higher voltage drops. A protection feature with system shut down for the higher currents/higher voltage drops may be realized with a comparator circuit.

Figure 7A:
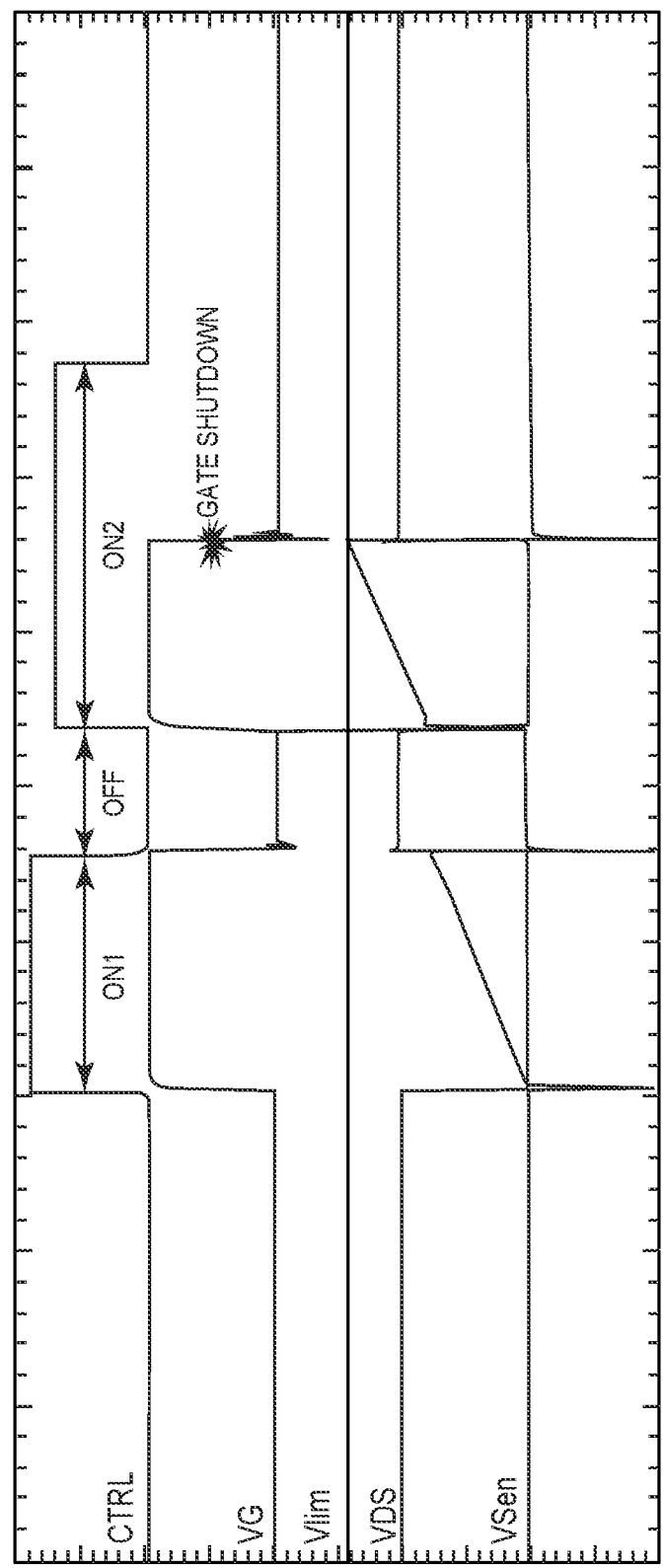
FIG. 7A illustrates various waveforms associated with an example of forced shutdown of a power transistor included in the semiconductor die.

FIG. 7A shows an example of forced shutdown ('Gate Shutdown') of the power transistor $T_{Main}$ in the first state, where 'VG' is the voltage applied to the gate of the power transistor $T_{Main}$, 'VDS' is the drain-to-source voltage of the power transistor $T_{Main}$, and VSen is the voltage drop sensed across the current sense resistor $R_{C\_Sense}$. As shown in FIG. 7A, the voltage VSen sensed across the current sense resistor $R_{C\_Sense}$ does not exceed an upper limit Vlim for the entire ON period ON1. Accordingly, the gate voltage VG of the power transistor $T_{Main}$ follows the switching control signal CTRL and the power transistor $T_{Main}$ remains on the entire ON1 period. The next ON period ('ON2') is longer than ON1 to increase the drain current of the power transistor $T_{Main}$. During ON2, the voltage VSen sensed across the current sense resistor $R_{C\_Sense}$ exceeds the upper limit Vlim before the end of ON2. In response, the driver 602 deactivates ('Gate Shutdown') the gate voltage VG of the power transistor $T_{Main}$ and the power transistor $T_{Main}$ is forced off before the end of ON2 even though the switching control signal CTRL is still active in the first state.

To emphasize the shutdown feature, temperature sensing via the dual mode sense terminal TCS of the semiconductor die is not shown in FIG. 7A. The die temperature may be sensed via the dual mode sense terminal TCS during the OFF period between the ON periods of the switching control signal CTRL, where the OFF period corresponds to the second state described herein. However, to emphasize the shutdown feature, the voltage Vsen is shown at 0 V during the temperature sensing window which corresponds to the OFF period between ON1 and ON2.

Figure 7B:
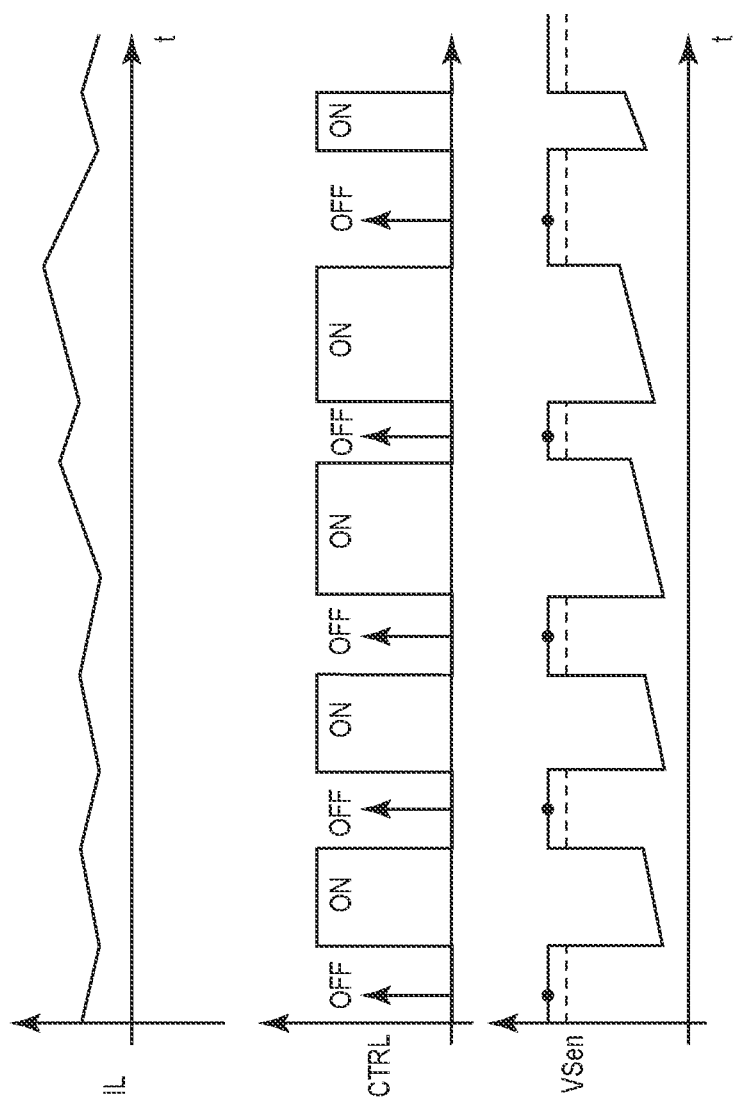
FIG. 7B illustrates various waveforms associated with an example of alternating between current and temperature sensing via the dual mode sense terminal.

FIG. 7B illustrates various waveforms associated with an example of alternating between current sensing in the first state and temperature sensing in the second state, both via the dual mode sense terminal TCS of the semiconductor die. In FIG. 7B, 'IL' represents a load current flowing into an inductor from the power transistor $T_{Main}$. The inductive load current IL increases when the power transistor $T_{Main}$ is on and decreases when the power transistor $T_{Main}$ is off. FIG. 7B also shows several ON periods and intervening OFF periods of the switching control signal CTRL. The first state corresponds to the ON periods of the switching control signal CTRL whereas the second state corresponds to the OFF periods. Current may be sensed continuously in the first state via the dual mode sense terminal TCS. Accordingly, the sensed voltage VSen changes proportionally to changes in the load current IL.

The die temperature may be sensed in the second state via the dual mode sense terminal TCS. In one embodiment, the die temperature is sensed after some settling time from the beginning of the OFF periods. The sampling points are indicated by the dots superimposed on the VSen waveform and the vertical arrows superimposed on the CTRL waveform during the OFF periods of the switching control signal CTRL. The temperature readout may be higher or lower than what is illustrated in FIG. 7B depending on the magnitude of the load current IL being switched, e.g., as indicated by the horizontal dashed line superimposed on the VSen waveform. A settling time may also be implemented for the current measurement.

In the second state, the driver 602 causes the gate driver stage 600 to switch off the power transistor $T_{Main}$, the current sense transistor $T_{Sense}$, and the toggle device 104 such that the toggle device 104 electrically decouples the dual mode sense terminal TCS of the semiconductor die from the current sense resistor $R_{C\_Sense}$. In the second state, flyback current flows in the reverse direction through the body diode of the current sense transistor $T_{Sense}$ and temperature sensing is based on the flyback current. The flyback current flows through the body diode, the temperature sense resistor $R_{T\_Sense}$ and out of the semiconductor die. The body diode is formed along the side of the gate trenches 304 adjacent the doped resistor region 328 which forms the temperature sense resistor $R_{T\_Sense}$.

The sense circuitry 604 may provide a constant voltage, e.g., via current/voltage source $V/I_{T\_Sense}$, for implanting temperature sensing. In this case, the sense circuitry 604 senses a voltage indicative of the temperature via a voltage divider, e.g., formed by a further resistor in series with the constant voltage source $V/I_{T\_Sense}$ and the temperature sense resistor $R_{T\_Sense}$. For example, the constant voltage may be 5V and the current flowing into the dual mode sense terminal TCS yields a resistance value. Another option includes a constant voltage plus a serial resistor which yields a voltage divider.

Instead of sensing a current flowing through the dual mode sense terminal TCS to determine the temperature of the semiconductor die, the sense circuitry 604 may instead provide a constant current, e.g., via current/voltage source $V/I_{T\_Sense}$, that flows through the temperature sense resistor $R_{T\_Sense}$ of the semiconductor die and sense the voltage drop between the source terminal S and the dual mode sense terminal TCS of the semiconductor die. In one embodiment, the constant current/constant voltage source $V/I_{T\_Sense}$ which provides the constant current is integrated in the driver 602.

The constant current may also be provided in the first state. In other words, the constant current/constant voltage source $V/I_{T\_Sense}$ does not necessarily have to be deactivated in the first state even though the constant current provided by the constant current/constant voltage source $V/I_{T\_Sense}$ is used for temperature sensing in the second state. In this case, the driver 602 may subtract a constant voltage offset from the voltage drop sensed across the current sense resistor $R_{C\_Sense}$ in the first state, the constant voltage offset corresponding to the constant current. Accordingly, the current/voltage source $V/I_{T\_Sense}$ does not interfere with the current sensing performed in the first state.

The driver 602 may determine the temperature of the semiconductor die based on the voltage drop sensed between the source terminal S and the dual mode sense terminal TCS of the semiconductor die or the sensed current flowing through the dual mode sense terminal TCS in the second state. This voltage drop corresponds to the voltage across the temperature sense resistor $R_{T\_Sense}$ formed by the doped resistor region 328 integrated in the semiconductor die, whereas the sensed current corresponds to the current flowing through the temperature sense resistor $R_{T\_Sense}$ in the second state.

The doped resistor region 328 that forms the integrated temperature sense resistor $R_{T\_Sense}$ of the semiconductor die has defined temperature characteristics, as previously described herein. In one embodiment, the driver 602 performs a calculation based on these defined temperature characteristics to determine die temperature. Separately or in combination, the value of the voltage signal yielded by sensing the voltage across the temperature sense resistor $R_{T\_Sense}$ or the value of the sensed current flowing through the dual mode sense terminal TCS may be adjusted with both the resistance value of the doped resistor region 328 integrated in the semiconductor die and with the value of the small signal current/constant voltage source $V/I_{T\_Sense}$. Typically, the output voltage over the temperature range of interest may be designed for 5V or 3.3V to be compatible with standard analog-to-digital converter circuits. Since the power transistor $T_{Main}$ may have fast switching transients, the sensor signal can have certain noise. Therefore, a triggered readout PWM center aligned during the second (off) state may be beneficial for temperature monitoring.

Instead of the driver 602 calculating the die temperature, the driver 602 may retrieve a temperature value from a look-up table (LUT) 606 included in or associated with the driver 602. The temperature value retrieved from the LUT 606 most closely corresponds to the voltage drop sensed between the source terminal S and the dual mode sense terminal TCS of the semiconductor die or the sensed current flowing through the dual mode sense terminal TCS in the second state. The driver 602 may use the retrieved temperature value as an approximation of the semiconductor die temperature, or the driver 602 may interpolate between two temperature values stored in the LUT 606 to determine the semiconductor die temperature.

The driver 602 or other circuit may include overvoltage protection circuitry such as a comparator that compares the voltage senses across the temperature sense resistor $R_{T\_Sense}$ to a reference value and forces off the power transistor $T_{Main}$ if the sensed voltage drop is outside a certain range, e.g., 3.3 to 5V.

Different comparator circuits may be used for the current and temperature readouts. For example, in the current sense mode when the power transistor $T_{Main}$, the current sense transistor $T_{Sense}$, and the toggle device 104 are on, a window comparator may be used for determining whether the power transistor $T_{Main}$ should be turned off. In the temperature sense mode when the power transistor $T_{Main}$, the current sense transistor $T_{Sense}$, and the toggle device 104 are off, the temperature readout may be taken near the center of the off period and connected to an ADC (analog-to-digital) channel to allow for temperature settling. A settling time may also be implemented for the current measurement, as well. The signal processing may be done outside the driver 602, e.g., using one or more external comparators. The toggle device 104 may integrated in the driver 602 or in a separate device such as a microcontroller. In one embodiment, the current sense resistor $R_{C\_Sense}$ and the toggle device 104 are attached to the same printed circuit board 608 as the electronic system 100 and the semiconductor die.

Figure 8:
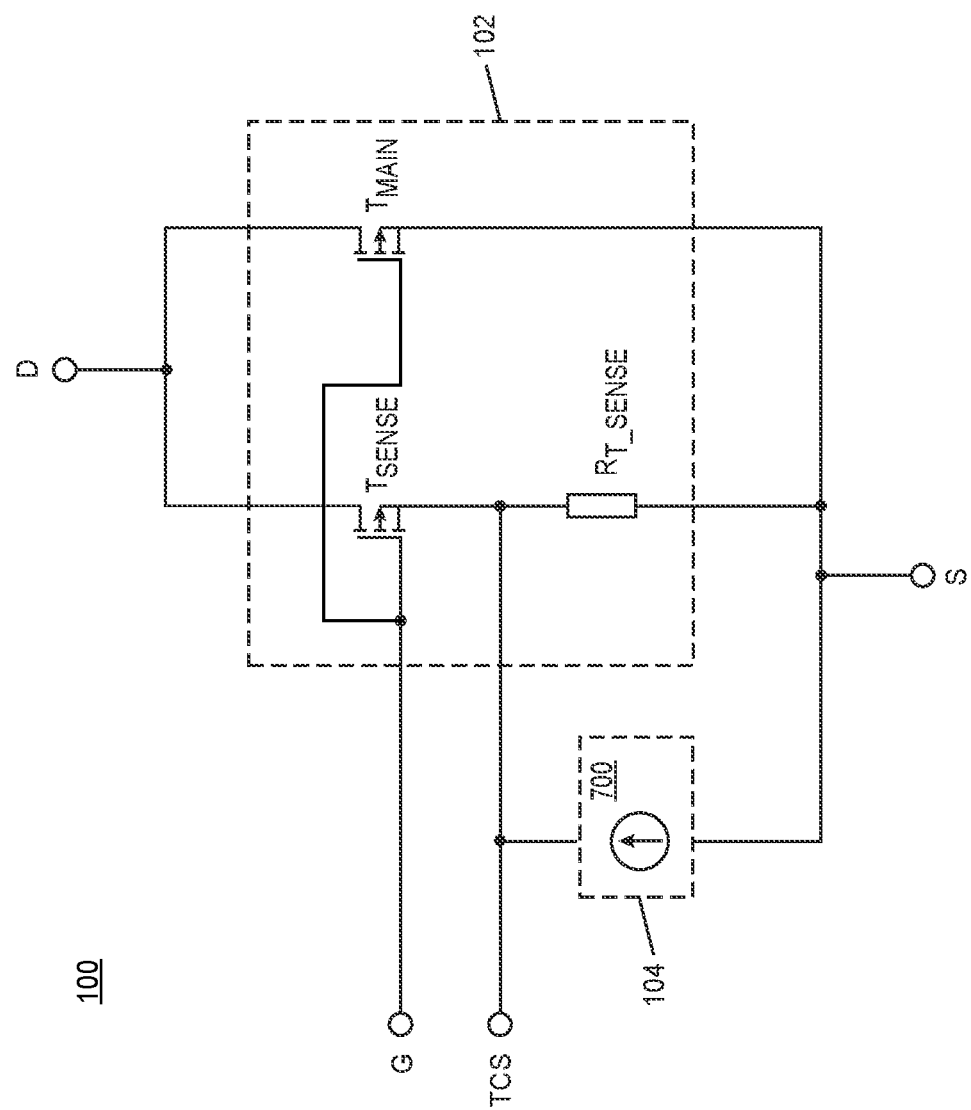
FIG. 8 illustrates a circuit schematic of another embodiment of the electronic system that includes the semiconductor die.

FIG. 8 illustrates a circuit schematic of another embodiment of the electronic system 100 that includes the semiconductor die. The embodiment illustrated in FIG. 8 is similar to the embodiment illustrated in FIG. 1. Different, however, the toggle device 104 is implemented as an operational amplifier 700. For example, the toggle device 104 may be an operational amplifier circuit that functions as a current-to-voltage amplifier 700 with an integrated low-ohmic sense resistor as the current sense resistor $R_{C\_Sense}$. Other types of toggle devices 104 may be used for coupling or decoupling the dual mode sense terminal TCS of the semiconductor die to the current sense resistor $R_{C\_Sense}$ based on the state of operation.

Although the present disclosure is not so limited, the following numbered examples demonstrate one or more aspects of the disclosure.

Example 1. A semiconductor die, comprising: a SiC substrate; a power transistor and a current sense transistor integrated in the SiC substrate such that the current sense transistor is configured to mirror current flow in the main power transistor; a gate terminal electrically connected to gate electrodes of both of the transistors; a drain terminal electrically connected to a drain region in the SiC substrate and which is common to both of the transistors; a source terminal electrically connected to source and body regions of the power transistor; a dual mode sense terminal; and a doped resistor region in the SiC substrate between the power transistor and the current sense transistor, wherein the dual mode sense terminal is electrically connected to source and body regions of the current sense transistor, wherein the doped resistor region has a same conductivity type as the body regions of both of the transistors and is configured as a temperature sense resistor that electrically connects the source terminal to the dual mode sense terminal.

Example 2. A semiconductor die, comprising: a SiC substrate; a power transistor and a current sense transistor integrated in the SiC substrate such that the current sense transistor is configured to mirror current flow in the main power transistor; a gate terminal electrically connected to gate electrodes of both of the transistors; a drain terminal electrically connected to a drain region in the SiC substrate and which is common to both of the transistors; a source terminal electrically connected to source and body regions of the power transistor; a dual mode terminal configured to alternate between current sensing and temperature sensing; and a doped resistor region in the SiC substrate between the power transistor and the current sense transistor, wherein the dual mode sense terminal is electrically connected to source and body regions of the current sense transistor, wherein the doped resistor region has a same conductivity type as the body regions of both of the transistors and is configured as a temperature sense resistor that electrically connects the source terminal to the dual mode sense terminal.

Example 3. The semiconductor die of example 2, wherein the dual mode terminal is configured to alternate between current sensing and temperature sensing based on a signal applied to the gate terminal.

Example 4. The semiconductor die of example 2 or 3, wherein the dual mode sense terminal is configured to receive a current during temperature sensing and is configured to output the mirrored current flowing through the current sense transistor during current sensing.

Example 5. The semiconductor die of any of examples 1 through 4, wherein the current sense transistor is laterally surrounded by the main power transistor in the SiC substrate, and wherein the doped resistor region is formed in a region of the SiC substrate that separates the current sense transistor from the main power transistor.

Example 6. The semiconductor die of any of examples 1 through 5, wherein along a first side of the current sense transistor, the doped resistor region extends between a gate trench of the current sense transistor and a gate trench of the main power transistor.

Example 7. The semiconductor die of any of examples 1 through 6, wherein the doped resistor region has a sheet resistance of at least 10 kΩ/square at 25° C.

Example 8. The semiconductor die of any of examples 1 through 7, wherein the power transistor comprises a plurality of stripe-shaped gate trenches, wherein the current sense transistor comprises a plurality of stripe-shaped gate trenches, and wherein the doped resistor region is formed in a region of the SiC substrate that separates the stripe-shaped gate trenches of the current sense transistor from the stripe-shaped gate trenches of the main power transistor.

Example 9. The semiconductor die of example 8, wherein the doped resistor region adjoins first mesas of the SiC substrate that separate adjacent ones of the stripe-shaped gate trenches of the main power transistor and that include the source and body regions of the power transistor, and wherein the doped resistor region adjoins second mesas of the SiC substrate that separate adjacent ones of the stripe-shaped gate trenches of the current sense transistor and that include the source and body regions of the current sense transistor.

Example 10. The semiconductor die of any of examples 1 through 9, further comprising a diode in the SiC substrate and connected in parallel with the doped resistor region.

Example 11. The semiconductor die of example 10, wherein the diode comprises a cathode formed in the doped resistor region, wherein the cathode contacts a metallization that forms or is electrically connected to the dual mode sense terminal, and wherein an anode of the diode is formed by the doped resistor region.

Example 12. A method of current and temperature sensing for a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the method comprising: in a first state: switching on the power transistor, the current sense transistor, and a toggle device such that the toggle device electrically couples the dual mode sense terminal of the semiconductor die to a current sense resistor; and sensing a voltage drop across the current sense resistor; and in a second state: switching off the power transistor, the current sense transistor, and the toggle device such that the toggle device electrically decouples the dual mode sense terminal of the semiconductor die from the current sense resistor; providing a constant current that flows through the temperature sense resistor of the semiconductor die, or electrically connecting a constant voltage source to the temperature sense resistor; and sensing a voltage drop between the source terminal and the dual mode sense terminal of the semiconductor die, or sensing a current flowing through the dual mode sense terminal.

Example 13. The method of example 12, further comprising: determining the temperature of the semiconductor die based on the voltage drop sensed between the source terminal and the dual mode sense terminal of the semiconductor die or the sensed current flowing through the dual mode sense terminal in the second state.

Example 14. The method of example 13, wherein determining the temperature of the semiconductor die comprises: retrieving a temperature value from a look-up table that most closely corresponds to the voltage drop sensed between the source terminal and the dual mode sense terminal of the semiconductor die or the sensed current flowing through the dual mode sense terminal in the second state.

Example 15. The method of any of examples 12 through 14, wherein the constant current is also provided in the first state, the method further comprising: subtracting a constant voltage offset from the voltage drop sensed across the current sense resistor in the first state, the constant voltage offset corresponding to the constant current.

Example 16. An electronic system for sensing current and temperature of a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the electronic system comprising: a current sense resistor; a toggle device electrically coupling the dual mode sense terminal of the semiconductor die to the current sense resistor; a driver; and sense circuitry, wherein in a first state: the driver is configured to switch on the power transistor, the current sense transistor, and the toggle device such that the toggle device electrically couples the dual mode sense terminal of the semiconductor die to the current sense resistor; and the sense circuitry is configured to sense a voltage drop across the current sense resistor; and in a second state: the driver is configured to switch off the power transistor, the current sense transistor, and the toggle device such that the toggle device electrically decouples the dual mode sense terminal of the semiconductor die from the current sense resistor; and the sense circuitry is configured to provide a constant current that flows through the temperature sense resistor of the semiconductor die or electrically connect a constant voltage source to the temperature sense resistor, and sense a voltage drop between the source terminal and the dual mode sense terminal of the semiconductor die or sense a current flowing through the dual mode sense terminal.

Example 17. The electronic system of example 16, wherein the driver is configured to determine the temperature of the semiconductor die based on the voltage drop sensed between the source terminal and the dual mode sense terminal of the semiconductor die or the sensed current flowing through the dual mode sense terminal in the second state.

Example 18. The electronic system of example 17, wherein the driver is configured to retrieve a temperature value from a look-up table that most closely corresponds to the voltage drop sensed between the source terminal and the dual mode sense terminal of the semiconductor die or the sensed current flowing through the dual mode sense terminal in the second state, to determine the temperature of the semiconductor die.

Example 19. The electronic system of any of examples 16 through 18, wherein the constant current is also provided in the first state, and wherein the driver is configured to subtract a constant voltage offset from the voltage drop sensed across the current sense resistor in the first state, the constant voltage offset corresponding to the constant current.

Example 20. The electronic system of any of examples 16 through 19, wherein the toggle device is a transistor.

Example 21. The electronic system of any of examples 16 through 19, wherein the toggle device is an operational amplifier.

Example 22. The electronic system of any of examples 16 through 21, wherein the current sense resistor and the toggle device are attached to a same printed circuit board as the electronic system and the semiconductor die.

Example 23. The electronic system of any of examples 16 through 22, wherein the sense circuitry comprises a constant current source for providing the constant current, and wherein the constant current source is integrated in the driver.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a SiC substrate;
   a power transistor and a current sense transistor integrated in the SiC substrate such that the current sense transistor is configured to mirror current flow in the main power transistor;
   a gate terminal electrically connected to gate electrodes of both of the transistors;
   a drain terminal electrically connected to a drain region in the SiC substrate and which is common to both of the transistors;
   a source terminal electrically connected to source and body regions of the power transistor;
   a dual mode sense terminal; and
   a doped resistor region in the SiC substrate between the power transistor and the current sense transistor,
   wherein the dual mode sense terminal is electrically connected to source and body regions of the current sense transistor,
   wherein the doped resistor region has a same conductivity type as the body regions of both of the transistors and is configured as a temperature sense resistor that electrically connects the source terminal to the dual mode sense terminal.

2. The semiconductor die of claim 1, wherein the current sense transistor is laterally surrounded by the main power transistor in the SiC substrate, and wherein the doped resistor region is formed in a region of the SiC substrate that separates the current sense transistor from the main power transistor.

3. The semiconductor die of claim 1, wherein along a first side of the current sense transistor, the doped resistor region extends between a gate trench of the current sense transistor and a gate trench of the main power transistor.

4. The semiconductor die of claim 1, wherein the doped resistor region has a sheet resistance of at least 10 kΩ/square at 25° C.

5. The semiconductor die of claim 1, wherein the power transistor comprises a plurality of stripe-shaped gate trenches, wherein the current sense transistor comprises a plurality of stripe-shaped gate trenches, and wherein the doped resistor region is formed in a region of the SiC substrate that separates the stripe-shaped gate trenches of the current sense transistor from the stripe-shaped gate trenches of the main power transistor.

6. The semiconductor die of claim 5, wherein the doped resistor region adjoins first mesas of the SiC substrate that separate adjacent ones of the stripe-shaped gate trenches of the main power transistor and that include the source and body regions of the power transistor, and wherein the doped resistor region adjoins second mesas of the SiC substrate that separate adjacent ones of the stripe-shaped gate trenches of the current sense transistor and that include the source and body regions of the current sense transistor.

7. The semiconductor die of claim 1, further comprising a diode in the SiC substrate and connected in parallel with the doped resistor region.

8. The semiconductor die of claim 7, wherein the diode comprises a cathode formed in the doped resistor region, wherein the cathode contacts a metallization that forms or is electrically connected to the dual mode sense terminal, and wherein an anode of the diode is formed by the doped resistor region.

9. A method of current and temperature sensing for a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the method comprising:
   in a first state:
      switching on the power transistor, the current sense transistor, and a toggle device such that the toggle device electrically couples the dual mode sense terminal of the semiconductor die to a current sense resistor; and
      sensing a voltage drop across the current sense resistor; and
   in a second state:
      switching off the power transistor, the current sense transistor, and the toggle device such that the toggle device electrically decouples the dual mode sense terminal of the semiconductor die from the current sense resistor;
      providing a constant current that flows through the temperature sense resistor of the semiconductor die, or electrically connecting a constant voltage source to the temperature sense resistor; and
      sensing a voltage drop between the source terminal and the dual mode sense terminal of the semiconductor die, or sensing a current flowing through the dual mode sense terminal.

10. The method of claim 9, further comprising:
    determining the temperature of the semiconductor die based on the voltage drop sensed between the source terminal and the dual mode sense terminal of the semiconductor die or the sensed current flowing through the dual mode sense terminal in the second state.

11. The method of claim 10, wherein determining the temperature of the semiconductor die comprises:
    retrieving a temperature value from a look-up table that most closely corresponds to the voltage drop sensed between the source terminal and the dual mode sense terminal of the semiconductor die or the sensed current flowing through the dual mode sense terminal in the second state.

12. The method of claim 9, wherein the constant current is also provided in the first state, the method further comprising:
    subtracting a constant voltage offset from the voltage drop sensed across the current sense resistor in the first state, the constant voltage offset corresponding to the constant current.

13. An electronic system for sensing current and temperature of a semiconductor die that includes a power transistor and a current sense transistor integrated in a SiC substrate, a source terminal, a dual mode sense terminal, and a doped resistor region in the SiC substrate between the power transistor and the current sense transistor, the doped resistor region having a same conductivity type as body regions of both of the transistors and being configured as a temperature sense resistor that electrically connects the source terminal to the dual mode sense terminal, the electronic system comprising:

a current sense resistor;

a toggle device electrically coupling the dual mode sense terminal of the semiconductor die to the current sense resistor;

a driver; and sense circuitry, wherein in a first state:

the driver is configured to switch on the power transistor, the current sense transistor, and the toggle device such that the toggle device electrically couples the dual mode sense terminal of the semiconductor die to the current sense resistor; and the sense circuitry is configured to sense a voltage drop across the current sense resistor; and in a second state:

the driver is configured to switch off the power transistor, the current sense transistor, and the toggle device such that the toggle device electrically decouples the dual mode sense terminal of the semiconductor die from the current sense resistor; and the sense circuitry is configured to provide a constant current that flows through the temperature sense resistor of the semiconductor die or electrically connect a constant voltage source to the temperature sense resistor, and sense a voltage drop between the source terminal and the dual mode sense terminal of the semiconductor die or sense a current flowing through the dual mode sense terminal.

14. The electronic system of claim 13, wherein the driver is configured to determine the temperature of the semiconductor die based on the voltage drop sensed between the source terminal and the dual mode sense terminal of the semiconductor die or the sensed current flowing through the dual mode sense terminal in the second state.

15. The electronic system of claim 14, wherein the driver is configured to retrieve a temperature value from a look-up table that most closely corresponds to the voltage drop sensed between the source terminal and the dual mode sense terminal of the semiconductor die or the sensed current flowing through the dual mode sense terminal in the second state, to determine the temperature of the semiconductor die.

16. The electronic system of claim 13, wherein the constant current is also provided in the first state, and wherein the driver is configured to subtract a constant voltage offset from the voltage drop sensed across the current sense resistor in the first state, the constant voltage offset corresponding to the constant current.

17. The electronic system of claim 13, wherein the toggle device is a transistor.

18. The electronic system of claim 13, wherein the toggle device is an operational amplifier.

19. The electronic system of claim 13, wherein the current sense resistor and the toggle device are attached to a same printed circuit board as the electronic system and the semiconductor die.

20. The electronic system of claim 13, wherein the sense circuitry comprises a constant current source for providing the constant current, and wherein the constant current source is integrated in the driver.

* * * * *